United States Patent [19]

Fukuma

[11] Patent Number: 4,488,811
[45] Date of Patent: Dec. 18, 1984

[54] BASE-LINE CORRECTION MEANS FOR SPECTROPHOTOMETER SYSTEM

[75] Inventor: Toshiaki Fukuma, Kyoto, Japan

[73] Assignee: Shimadzu Corporation, Kyoto, Japan

[21] Appl. No.: 359,902

[22] Filed: Mar. 19, 1982

[30] Foreign Application Priority Data

Jun. 30, 1981 [JP] Japan .............................. 56-102813

[51] Int. Cl.³ .............................................. G01J 3/42
[52] U.S. Cl. ................................................. 356/319
[58] Field of Search ....................... 356/319, 323–325; 364/498

[56] References Cited

U.S. PATENT DOCUMENTS

| | | | |
|---|---|---|---|
| 3,646,331 | 2/1972 | Lord | 356/319 X |
| 4,171,913 | 10/1979 | Wildy et al. | 356/325 |
| 4,293,222 | 10/1981 | Caruso et al. | 356/319 |

Primary Examiner—F. L. Evans
Attorney, Agent, or Firm—Birch, Stewart, Kolasch & Birch

[57] ABSTRACT

A spectrophotometer system including a monochrometer which scans a sample in a sample cell with discrete wavelengths of light, and measures intensity signals of at least two discrete wavelengths of light emitted from the sample. These measured intensity signals are base-line corrected by a computer with respect to reference intensity signals at corresponding wavelengths. The computer also calculates base-line corrected intensity signals for wavelengths of light intermediate said two wavelengths of light from the intensity signals of said two respective discrete wavelengths. All base-line corrected intensity signals are stored for analysis of the sample.

2 Claims, 4 Drawing Figures

BASE-LINE CORRECTION MEANS FOR SPECTROPHOTOMETER SYSTEM

BACKGROUND OF THE INVENTION

The present invention relates to a spectrophotometer system and, more particularly, a base-line correction means for a spectrophotometer system controlled by a computer.

In a spectrophotometer system for measuring optical data such as transmission or apparent reflectance of visible light as a function of wavelength, conventionally, several discrete values of independent variables are sampled for recording or data processing in the spectrophotometer system controlled by a computer.

A base-line as used herein means a line drawn in a graphical representation of a varying physical quantity such as a voltage to indicate a reference value such as the voltage value which is measured in the absence of any samples. A base-line correction as used herein means to calculate true values when any sample is applied by subtracting the reference value from measured values.

To cause the base-line correction, it is ideal that several discrete values used for the base-line correction are measured and memorized in the computer. However, this requires a great capacity of a computer memory so that it is impractical.

Therefore, the several discrete values for the base-line correction are thinly measured more than the sampled and measured values. The several discrete values are memorized in the computer memory. The values for the base-line correction are calculated with interpolation, the values being applied to the measured values in the sampling points except for the base-line correction sampling points.

However, for this interpolation, the values for the base-line correction must be calculated at every one of the sampling points, so that such calculation needs a long time and, therefore, scanning speed for measurement must be limited to slow speeds.

In view of these problems, it is desired to minimize the time used for calculating the values for the base-line correction with a small computer memory.

SUMMARY OF THE INVENTION

Accordingly, it is an object of the present invention to provide an improved spectrophotometer system.

It is another object of the present invention to provide improved base-line correction means for a spectrophotometer system.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to a preferred embodiment of the present invention, a spectrophotometer system comprises monochrometer means for producing a spectrum for visual observation, optical means for selectively containing a sample, the optical means receiving the spectrum from the monochrometer means, and computing means responsive to the optical means for calculating base-line corrections for optical data measured in the presence of the sample in the optical means, on the basis of reference optical data measured in the absence of the sample in the optical means.

Preferably, the optical measured data and the reference optical data are represented in a binary decimal system. A memory means may be further provided for memorizing the optical data and the reference optical data. A recording means may be provided for recording results of the base-line correction calculated by the computing means.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE PREFERRED EMBODIMENT

According to the present invention, several discrete values of independent variables for base-line correction are measured and memorized. A point at which one of the values for the base-line correction is measured is referred to as a starting point. An intermediate point represents a point between the starting points, at which one of the values for the base-line correction is calculated by interpolation. The intermediate point is obtained by equally dividing the distance between two adjacent starting points.

Figure 1:
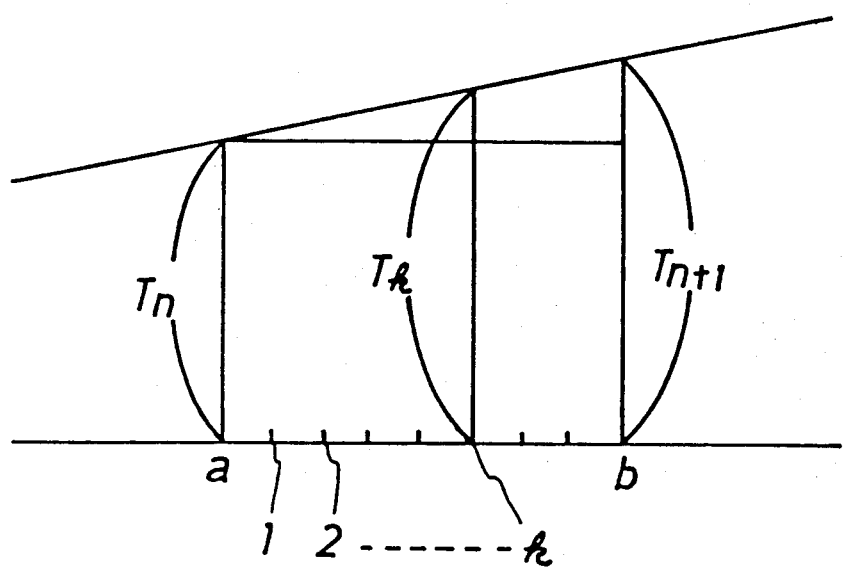
FIG. 1 shows a graph for explaining the calculation for base-line correction according to the present invention.

FIG. 1 shows part of a sloped base-line obtained by measuring values when a spectrophotometer is scanned in the absence of any samples. a and b indicate the starting points. Each of a and b is represented by a frequency. Base-line data of Tn and Tn+1 at the starting points are sampled and memorized in a computer memory. The intermediate points are represented by 1,2, ... K ..., which are obtained by dividing the distance between a and b into equal spaces of $2^n$.

The base-line data of $T_K$ at an intermediate point k are calculated with the following equation.

$$T_K = k/2^n(T_{n+1} - T_n) + T_n \quad (1)$$

Since a computer is equipped within the spectrophotometer system of the present invention, the base-line data of Tn is represented in a binary decimal system. Therefore, the calculation of $T_{n+1} - T_n/2^n$ is enabled by shifting the code of a numerator to a lower digit by n. For example "3" in a decimal notation is represented by (11) in the binary decimal notation. Therefore, (11) divided by "2" is obtained to be (1.1) by shifting the codes to a single digit. (0.1) in the binary decimal notation is $2^{-1}$ in the decimal notation.

Therefore, equation (1) represents that the base-line data of Tn and $T_{n+1}$ are extracted from the memory and they are subtracted to be $(T_{n+1} - Tn)$. Thereafter, the subtracted data codes are shifted to a lower digit by n to obtain the difference between $T_n$ and $T_{n+1}$. The subtracted data divided by $2^n$ is referred to as a correction factor. The correction factor is multiplied by k.

When the monochrometer is scanning the sample for measurement, the correction factor between a and b is calculated, whereby a plurality of correction factors are subsequently added to $T_n$, while the monochrometer is related to the intermediate points of 1,2, ... k .... The thus derived $T_k$ is subtracted from the measured value at the intermediate point k to obtain the value subjected to the base-line correction according to the present invention.

As is apparent from the above calculation, addition and subtraction at the starting points are the only essential steps performed to obtain the base-line correction. Calculation in computers requires a longer time for division > multiplication > (addition and subtraction). Therefore, to minimize the calculation period, it is desired to obviate the division from the calculation of the base-line correction. As a result, the scanning speed of the spectrophotometer is not limited by the calculation period. According to the present invention, the division can be obviated from the calculation of the base-line correction by shifting the codes to a lower digit. Therefore, the scanning speed of the spectrophotometer system can increase.

Figure 2:
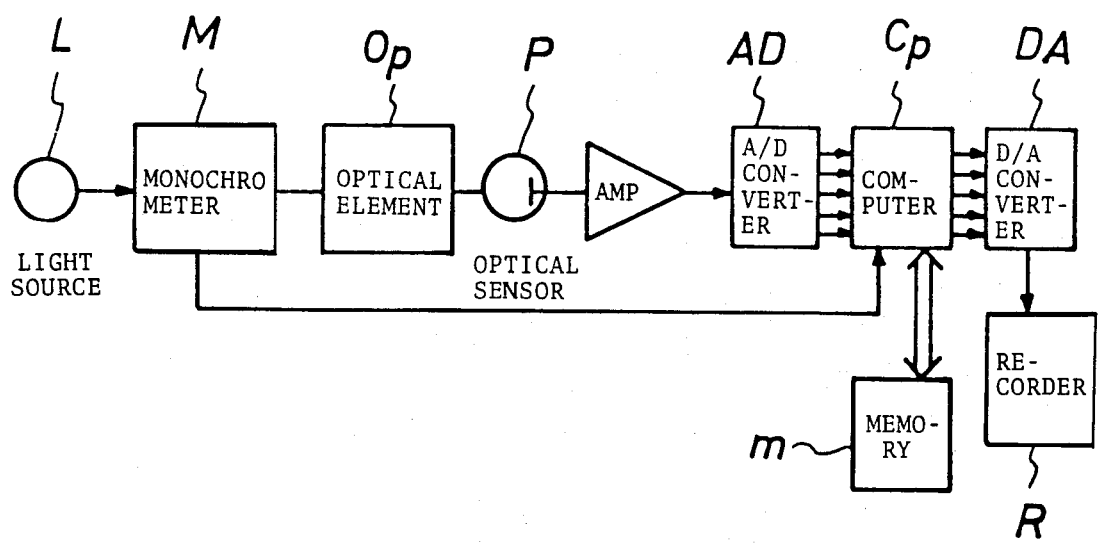
FIG. 2 shows a block diagram of a spectrophotometer system according to the present invention.

FIG. 2 shows a block diagram of the spectrophotometer system of the present invention. The system comprises a light source L, a monochrometer M, an optical element Op, an optical sensor P, an amplifier A, an A/D converter AD, a D/A converter DA a recoder R, a memory m, and a computer Cp.

Any sample is contained in the optical element Op. Monochromatic light emitted from the monochrometer M is incident upon the sample. The computer Cp functions to detect the wavelength of the monochrometer M, calculate the above-described base-line correction, and cause the recording of the measured results.

Figure 3:
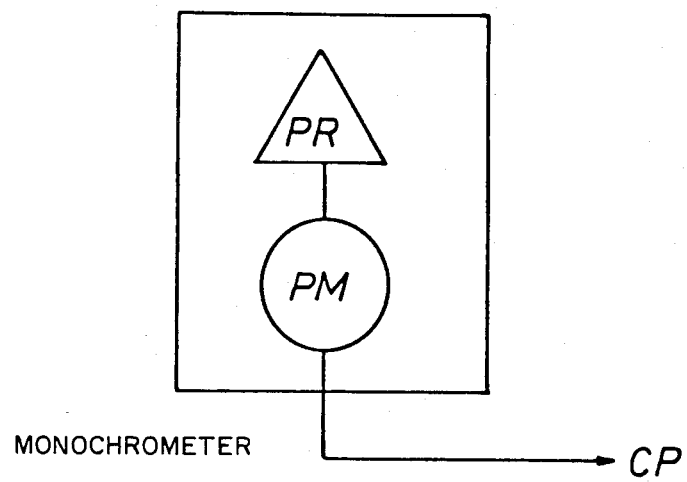
FIG. 3 shows a diagram of a monochrometer incorporated in the spectrophotometer of FIG. 2.

FIG. 3 shows a diagram of the monochrometer M for producing a spectrum for visual observation. The monochrometer M comprises a prism PR (or a grating) and a pulse motor PM. The pulse motor PM drives the prism PR. The computer Cp detects the frequency of the monochromatic light by counting drive pulses of the pulse motor PM.

For measuring the base-line correction data at the starting point, firstly, while the optical element Op has a cell free of any sample, the monochrometer M scans the cell with varying wavelengths of light. The space between each of the intermediate points is previously provided. The computer Cp samples an output from the optical sensor P at a beginning point of the monochromatic light. The output from the optical sensor P is analog-digitally converted to memorize the data in a particular address in the memory M. As frequency scanning of the monochromatic light is enabled, the computer Cp counts up at each of the intermediate points. When the counted value becomes $2^n$, the measured data are sampled so that they are stored in a particular address in the memory M. Simultaneously, the counted values are initialized to be 0. Then, these operations are repeated to the end of the measurement range.

For measuring data in the presence of the sample, firstly, the cell having any sample is placed in the optical element Op. The computer Cp controls the wavelength scanning of the monochrometer M. When the starting point a is selected, the base-line data of $T_n$ and $T_{n+1}$ are extracted from the memory m and subtracted. The resulting code is shifted to a lower digit by n to calculate the correction factor. The correction factor is stored in a particular address in the memory m. The base-line correction data of $T_k$ is thus obtained. The base-line correction data $T_n$ at a is also admitted to an adder circuit in the computer Cp.

Each time a wavelength of the monochrometer M reaches an intermediate point, base-line data is extracted from a particular address in the memory m, so that the base-line data is added to base-line correction data stored in the adder circuit, which is related to a point just preceding the intermediate point of the base-line data. The resulting data is subtracted from the sampled and measured data. The D/A converter DA is operated to obtain the analog data which is recorded by the recorder R. The thus derived base-line correction data is directly applied to the adder circuit. When a wavelength of the monochrometer M is scanned to a next intermediate point, the correction factor is further added to the base-line correction data so as to obtain further base-line correction data.

In this manner, the measuring operations are conducted. The base-line correction at the starting points a and b are enabled by subtracting the base-line correction data at a and b from the sampled and measured data.

Figure 4:
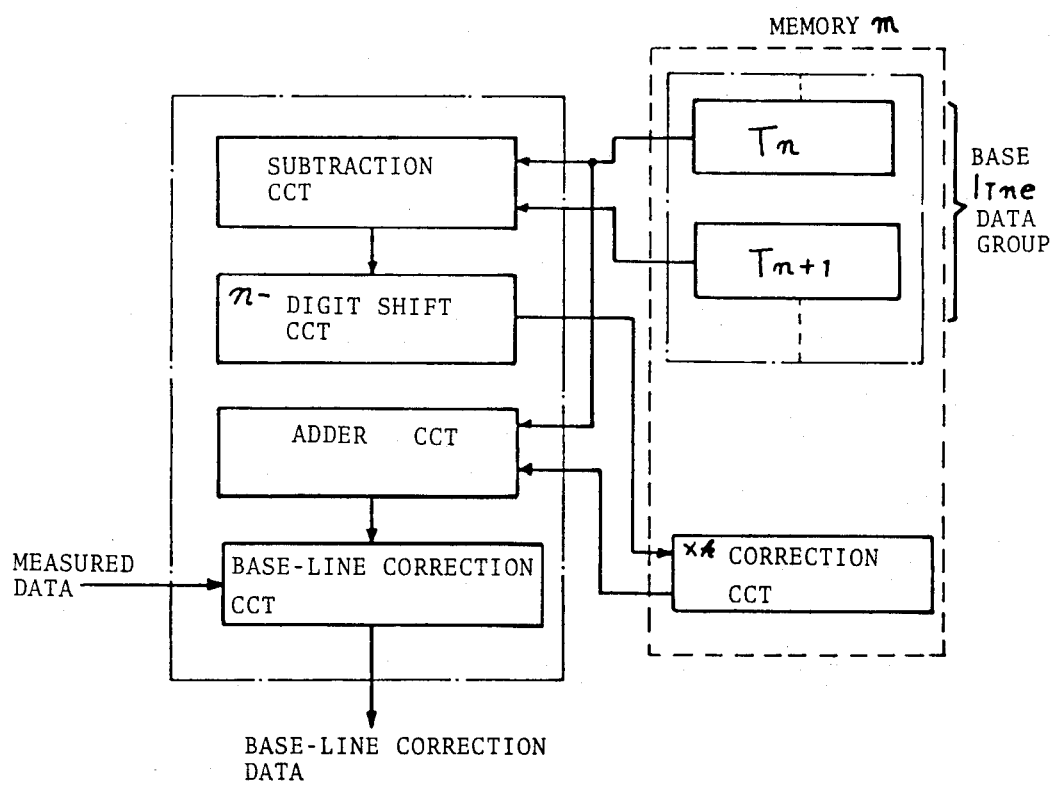
FIG. 4 shows a block diagram of a circuit included within a computer and a memory both incorporated in the spectrophotometer of FIG. 2.

FIG. 4 shows a block diagram of the computer Cp and the memory m. The computer Cp comprises an operation circuit containing a subtraction circuit, an n-digit shift circuit, an adder circuit, and a base-line correction circuit. The memory m stores a group of base-line data measured by sampling.

At the starting points a and b, the base-line data of $T_n$ and $T_{n+1}$ is directly applied to the base-line correction circuit, to correct the measured data. At the intermediate points, the base-line correction data is calculated on the basis of the base-line data of $T_n$ and $T_{n+1}$ by transferring these data into the subtraction circuit. The codes of the resulting data are shifted to a lower digit by n. Then, the correction factor $t_k$ is calculated as follows:

$$t_k 1/2^n (T_{n+1} - T_n) \tag{2}$$

The correction factor is stored in a particular address in the memory m. Each time one of intermediate points is selected, the related correction factor is extracted, which is added to data just preceding one of the intermediate points.

Therefore, the base-line data at a first intermediate point is represented by $T_n + t_k$. The base-line data at a second intermediate point is represented by $T_n + 2t_k$. Those at a third intermediate point are represented by $T_n + 3t_k$. Thus, the base-line data at each of the intermediate points is obtained.

Although the data measured is sampled at the starting points and the intermediate points in the above-described preferred embodiment of the present invention, the present invention should not be limited to this system. Between the intermediate points, the data measured can be sampled for recording. Between the intermediate points i and i+1, the base-line correction data is selected to be the base-line correction data at the intermediate point i. As a result, the base-line correction data are changed stepwise. However, as the number of $2^n$ can be freely enlarged, a smooth change of the base-line correction can be enabled in practice.

It may be possible that the correction factor at each of the starting point is previously calculated and stored in the memory m, in which the equal division of the intermediate points is not be needed so that the addition is merely required in calculating the base-line correction. However, in such a case, the capacity of the memory m for storing the base-line correction data must be approximately doubled as compared to the case of the equal division of $2^n$.

As described above, in accordance with the present invention, the base-line correction is conducted with only the use of addition and subtraction at the starting points. Division is not required. Therefore, the scanning speed can increase. It is advantageous that the capacity of the memory for storing the base-line correction data can be minimized.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A spectrophotometer system comprising:

light source means for generating a beam of light;

sample cell means containing a sample to be analyzed;

monochrometer means for scanning said sample cell means with discrete wavelengths of light from said beam;

optical sensor means for measuring intensity signals Tn and Tn+1 of first and second discrete wavelengths of light emitted from said sample cell means;

computing means responsive to the intensity signals Tn and Tn+1 of said first and second wavelengths measured by said optical sensor means for performing base-line corrections thereon, and on intensity signals Tk of light having wavelengths intermediate to said first and second wavelengths, said base-line corrections being computed from the relationship between intensity signals Tn and Tn+1, which are measured with a sample in said sample cell, and reference intensity signals measured with no sample in said sample cell, said intermediate intensity signals Tk being computed from the following equation, $$T_k = k/2^n(T_{n+1} - T_n) + T_n$$

, where k is one of said intermediate wavelengths of light, n is said first wavelength and n+1 is said second wavelength; and means for storing said intensity signals Tn, Tn+1 and Tk for analyzing said sample.

2. The spectrophotometer system according to claim 1, wherein Tn and $T_{n+1}$ are represented in a binary decimal system so that $(T_{n+1} - Tn)/2^n$ is calculated by shifting a code of $(T_{n+1} - Tn)$ to a lower digit by n.

* * * * *